United States Patent [19]
Duinkerken et al.

[11] Patent Number: 5,661,091
[45] Date of Patent: Aug. 26, 1997

[54] METHOD OF MANUFACTURING A SEMICONDUCTOR DEVICE HAVING PN JUNCTIONS SEPARATED BY DEPRESSIONS

[75] Inventors: Geert J. Duinkerken; Jozeph P.K. Hoefsmit; Josef P. Keizer, all of Stadskanaal, Netherlands

[73] Assignee: U.S. Philips Corporation, New York, N.Y.

[21] Appl. No.: 479,018

[22] Filed: Jun. 6, 1995

Related U.S. Application Data

[63] Continuation of Ser. No. 173,316, Dec. 22, 1993, abandoned.

[30] Foreign Application Priority Data

Dec. 23, 1992 [EP] European Pat. Off. .............. 92204065

[51] Int. Cl.⁶ .................................................. H01L 21/301
[52] U.S. Cl. .................. 438/424; 148/DIG. 28; 438/458; 438/464; 438/461; 438/421
[58] Field of Search ............... 437/226, 67, 227; 148/DIG. 28

[56] References Cited

U.S. PATENT DOCUMENTS

| | | | |
|---|---|---|---|
| 3,383,760 | 5/1968 | Shwartzman | 437/227 |
| 3,423,823 | 1/1969 | Ansley | 437/226 |
| 3,500,139 | 3/1970 | Frouin et al. | 437/67 |
| 3,579,815 | 5/1971 | Gentry | 437/226 |
| 3,689,993 | 9/1972 | Tolar | 29/583 |
| 3,699,402 | 10/1972 | McCann et al. | 317/235 R |
| 3,852,876 | 12/1974 | Sheldon et al. | 437/226 |
| 4,135,291 | 1/1979 | Tursky et al. | |
| 4,179,794 | 12/1979 | Kosugi et al. | 437/226 |
| 4,197,631 | 4/1980 | Meyer et al. | 437/226 |
| 4,525,924 | 7/1985 | Schaefer | 437/226 |
| 4,955,934 | 9/1990 | Stehr | |
| 5,017,512 | 5/1991 | Takagi | 437/226 |
| 5,136,354 | 8/1992 | Morita et al. | 437/226 |
| 5,164,813 | 11/1992 | Blackstone et al. | 257/623 |
| 5,393,711 | 2/1995 | Biallas et al. | 437/231 |

FOREIGN PATENT DOCUMENTS

| | | | |
|---|---|---|---|
| 2538616 | 6/1984 | France | |
| 1514363 | 6/1970 | Germany | |
| 53-123657 | 10/1978 | Japan | 437/226 |
| 55-74150 | 6/1980 | Japan | 437/226 |
| 56-115548 | 9/1981 | Japan | 437/226 |
| 60-60234 | 4/1987 | Japan | 437/226 |
| 3-234033 | 10/1991 | Japan | 437/226 |
| 4-223356 | 8/1992 | Japan | 437/226 |
| 9308592 | 4/1993 | WIPO | |

OTHER PUBLICATIONS

Saitou, M., "Manuf. of Mesa–. . . " Japanese Patent Abstract 57–148371, Sep. 13, 1982.

Primary Examiner—Charles L. Bowers, Jr.
Assistant Examiner—Leon Radomsky
Attorney, Agent, or Firm—Steve R. Biren

[57] ABSTRACT

The invention relates to a method of manufacturing semiconductor devices in which a slice of semiconductor material is provided with a pn junction aligned parallel to the main surfaces of the slice. After the pn junctions is provided, depressions are provided in one main surface. These depressions cut through the pn junction, thereby dividing the main pn junction into mutually insulated pn junction portions. Before the slice is split up into separate semiconductor bodies, a layer of insulating material is provided. This method of manufacturing semiconductor devices allows for a simple application of the insulating layer to the walls of the depressions.

9 Claims, 4 Drawing Sheets

METHOD OF MANUFACTURING A SEMICONDUCTOR DEVICE HAVING PN JUNCTIONS SEPARATED BY DEPRESSIONS

This is a continuation of application Ser. No. 08/173,316, filed on Dec. 22, 1993abandoned.

BACKGROUND OF THE INVENTION

The invention relates to a method of manufacturing semiconductor devices whereby a pn junction extending parallel to main surfaces of a slice of semiconductor material is provided in said slice, after which depressions are provided in a main surface which cut through the pn junction, so that mutually insulated pn junctions are created, and the slice is split up into separate semiconductor bodies at the areas of some of said depressions, each body comprising a number of the pn junctions, while a layer of insulating material is provided on walls of the depressions. The invention also relates to a semiconductor device provided with a number of pn junctions separated each time by a depression.

The method serves to manufacture semiconductor devices which comprise bodies provided with a number of insulated pn junctions separated from one another by depressions. Semiconductor material below the depression forms an electrical connection between regions at one side of the pn junctions, so that these regions can be connected through one connection point. The regions at the other side of the pn junctions are separated from one another by the depressions. These regions can be connected each to a connection point which is separate for the relevant pn junction. Thus, for example, a number of diodes provided with a common anode or cathode, or a number of transistors, for example having a common collector or emitter, may be manufactured.

The slice of semiconductor material is provided with a doped surface zone in a usual manner, for example, by diffusion, which zone forms the pn junction with the material of the slice. The depressions may be provided in various ways, for example, in that a portion of a surface of the slice is covered and the uncovered portion is etched away, or in that grooves are sawn into the surface. Splitting-up of the slice of semiconductor material into separate semiconductor bodies takes place, for example, in that the slice is etched, sawn, or broken through. The depressions cut through the pn junction, so that the pn junction comes to the surface on walls of the depressions. An insulating layer, for example of glass or oxide, is accordingly provided on these walls, for example, by electrophoresis or chemical vapour deposition (CVD).

U.S. Pat. No. 3,699,402 discloses a method of the kind mentioned in the opening paragraph whereby depressions in the form of a system of parallel grooves are provided in each of two main surfaces of the slice of semiconductor material. The grooves in the one main surface have a longitudinal direction which is transverse to that in the other main surface. The slice is split up into separate semiconductor bodies in that the slice is separated at the area of each groove in the one main surface and at the area of every other groove in the other main surface. Separate semiconductor bodies comprising two diodes each are thus created. A layer of insulating material is finally provided on the walls of the grooves.

The known method described has the disadvantage that the provision of a layer of insulating material on the groove walls is difficult because it is provided after the slice has been split up into separate semiconductor bodies. The semiconductor bodies are then comparatively small and therefore difficult to handle. Since grooves are made in both main surfaces of the slice, in addition, the bodies must be provided with an insulating layer on both sides.

SUMMARY OF THE INVENTION

The invention has for its object to provide a method whereby the provision of the insulating layer on walls is simplified.

According to the invention, the method is for this purpose characterized in that the depressions are provided in one main surface of the slice only and in that the layer of insulating material is provided before splitting-up of the slice.

It is achieved in this way that the provision of the insulating layer on the walls of the depressions can take place in a simple manner in that an insulating layer is provided in all depressions while the slice of semiconductor material has not yet been split up into separate semiconductor bodies. One slice of semiconductor material is easier to handle than the many separate bodies in the known method. In addition, this layer need be provided on depressions in one main surface only now.

The invention is based on the recognition that it is not necessary to cover surfaces created after splitting-up of the slice with the insulating layer. These surfaces are covered in the known method, but it is found to be possible in practice to manufacture good semiconductor devices without the surfaces which arise during splitting-up being provided with an insulating layer.

In the known method, semiconductor bodies are manufactured with pn junctions mutually insulated by means of depressions, so that semiconductor material below these depressions forms an electrical connection between regions at one side of the pn junctions. It is found in practice that such a junction often is not of a sufficiently low ohmic value. In the known method, accordingly, the semiconductor bodies are provided on an insulating substrate provided with a conductive layer which short-circuits the semiconductor material below the depression. In the method according to the invention, preferably, the slice of semiconductor material is fastened on an electrically conducting auxiliary slice, preferably made of the semiconductor material, before the depressions are provided, after which the auxiliary slice is split up together with the slice of semiconductor material. The separate semiconductor bodies then comprise a number of pn junctions on one support body which can act as a common connection electrode. Regions at one side of the pn junctions are electrically satisfactorily interconnected because of the electrical conduction of the support body. So it is not absolutely necessary to mount the bodies on a substrate having a conductive top layer, as in the known method. When the auxiliary slice is chosen to be of the same material as the slice of semiconductor material, problems arising from differences in expansion coefficients between the auxiliary slice and the slice of semiconductor material are non-existent.

The slice of semiconductor material is weakened by the provision of the depressions. When the semiconductor body is placed, for example, on a pc-board, the semiconductor body may fracture at the areas of depressions. Preferably, therefore, the method is characterized in that the layer of insulating material is provided to such a thickness that the depressions are substantially entirely filled with insulating material. The semiconductor body now is much stronger so that problems in the placement of the semiconductor body are avoided.

In an advantageous embodiment of the method according to the invention, the layer of insulating material is provided through filling of the depressions with a glass dispersion and subsequently subjecting the auxiliary slice together with the slice to a heat treatment. The layer of insulating material may thus be provided in a simple manner and with sufficient accuracy in the depressions, for example, with a dispensing device such as a nozzle. It is not necessary then to screen surfaces which are not to be covered by the insulating layer. The glass dispersion is sintered by the elevated temperature of the heat treatment, so that the layer of insulating material is given good insulating and passivating properties.

The auxiliary slice and the slice of semiconductor material are split up into bodies at the locations of depressions, for example, through breaking, etching or sawing. Preferably, depressions are provided to a certain given width and splitting-up takes place through sawing, the width of the depressions being chosen to be greater than that of a sawcut used during sawing. Such a width for the depressions renders it possible to split up the auxiliary slice and the slice of semiconductor material without the layer of insulating material being damaged where this layer of insulating material is provided over the pn junction. Sawing preferably takes place from the upper side of the semiconductor slice. Splitting-up can then take place with greater accuracy because the depressions are visible and it can be immediately checked whether the sawcut is applied in the correct position. The comparatively great width of the depression also renders it easier to provide the glass dispersion which is necessary for passivating the walls of the depression.

An additional advantage is obtained when the depressions are provided through the removal of material from the slice of semiconductor material by means of a bombardment with abrasive particles. In such a process, also called sand blasting or shot peening, as applicable, portions of the slice of semiconductor material can be removed in a simple manner and with a comparatively high accuracy. Such a method has the additional advantage over, for example, an etching process, that it is an environmentally comparatively clean method because the abrasive particles can be collected and re-used afterwards. In addition, depressions with a comparatively great width can be provided comparatively simply by this method, so that the application of the glass dispersion is simple, while moreover sawing-through is easy.

Each pn junction must be provided with an electrode at an upper side of the separate semiconductor body in order to be able to connect the individual pn junctions in the separate semiconductor bodies. This may be done in that an electrode is provided selectively at the upper side of the semiconductor slice, for example, by means of photolithographical and etching techniques. In an advantageous embodiment of the invention, a conductive layer is provided on the main surface comprising the depressions before the slice is split up, after which the conductive layer is interrupted through the provision of grooves in the conductive layer at the areas of the depressions, which grooves extend into the insulating layer, upon which the slice is split up into separate semiconductor bodies. The grooves in the conductive layer need only be provided in those depressions which in the individual semiconductor bodies separate the pn junctions in the semiconductor body. During splitting-up of the slice into separate semiconductor bodies, the individual electrodes are then formed at the upper sides of the separate semiconductor bodies.

Preferably, a slice of semiconductor material is used as the auxiliary slice, and splitting-up is done through sawing, whereby the separate semiconductor bodies are provided each with a plane sawcut surface which is suitable as a mounting surface for the semiconductor bodies, while the auxiliary slice has such a thickness that semiconductor bodies of standard dimensions for surface mounted devices are obtained. Splitting-up is done through sawing, for example wire sawing, for example perpendicular to a main surface of the slice of semiconductor material. The semiconductor device is then immediately suitable for mounting on a pc-board as a surface mounted device (SMD). When a slice of semiconductor material is used as the auxiliary slice with such a thickness that a surface mounted device of standard dimensions is obtained, mounting of a semiconductor device obtained by the method in standard machines becomes simple.

The invention also relates to a semiconductor device comprising a semiconductor body with pn junctions extending parallel to its upper and lower surfaces and mutually separated by one or several depressions provided in the upper surface, so that the pn junctions form separate diodes which are all connected to a first region at one side of the pn junction adjoining the lower surface, while each individual diode is connected to a further region at the other side of the pn junction adjoining the upper surface, and walls of the depression are covered with a layer of insulating material. According to the invention, this semiconductor device is characterized in that the semiconductor body comprises an electrically conducting support body, preferably made of the semiconductor material, which forms part of the first region, while a recess is formed around the semiconductor body extending up to the upper surface of the semiconductor body and covered with a layer of insulating material. Compared with known semiconductor devices, this semiconductor device has the advantage that it can be manufactured by the method indicated above in a comparatively simple manner. In addition, the presence of the support body ensures a good electrical connection between the diodes.

Preferably, the semiconductor device comprises a first semiconductor body with two separate diodes with a first region acting as a common cathode and a second semiconductor body with two separate diodes with a first region acting as a common anode, while the first and the second semiconductor body are interconnected by two connecting strips between the further regions of the first and the second semiconductor body so as to form a bridge cell. A very compact bridge cell is created in this manner which is easy to manufacture by the method according to the invention.

BRIEF DESCRIPTION OF THE DRAWING

The invention will be explained in more detail below by way of example with reference to drawings, in which.

The Figures are purely diagrammatic and not drawn to scale. Corresponding parts are generally given the same reference numerals in the Figures.

DESCRIPTION OF THE PREFERRED EMBODIMENTS

Figure 1:
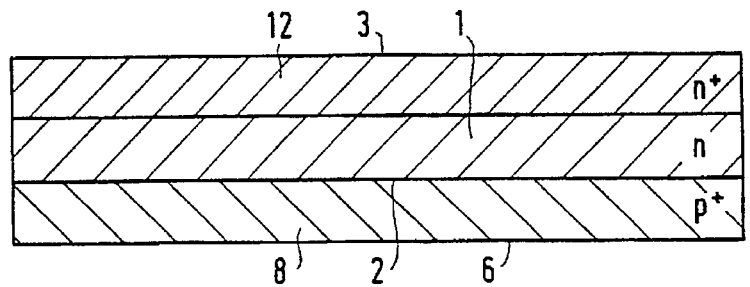
FIGS. 1, 2 are cross-sections of a semiconductor slice in different stages of the method.
Figure 2:
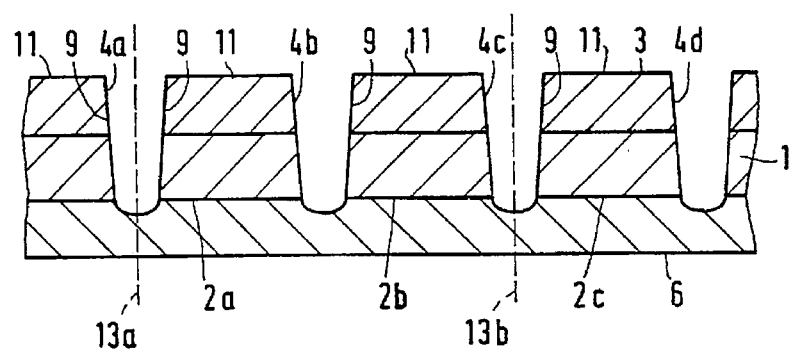

FIGS. 1 to 4 show stages in a method whereby a pn junction 2 extending parallel to main surfaces 3, 6 is provided in a slice of semiconductor material 1, after which depressions 4 are provided in a main surface 3 which cut through the pn junction 2, so that mutually separated pn junctions 2a, 2b, 2c are created, and the slice 1 is split up at some of these depressions 4a, 4c into separate semiconductor bodies 10 which comprise a number of the pn junctions 2a, 2b, a layer of insulating material 5 being provided on walls of the depressions.

FIG. 1 shows an n-type silicon slice 1 which is provided with a $p^+$-type and an $n^+$-type doped surface zone 8 and 12, respectively, in usual manner, for example by diffusion into both main surfaces 3, 6, the zone 8 forming the pn junction 2 with the n-type material of the slice 1. The depressions 4 are provided in that a portion of the surface of the slice 1 is covered with photoresist and the uncovered portion is etched away. The depressions 4 have the shape of two systems of parallel grooves. The grooves of the one system have a longitudinal direction which is transverse to that of the other system. The pn junctions 2a, 2b, 2c are then present in rectangular mesa structures 9. The mesa structures 9 then comprise plane upper surfaces or plateaus 11 surrounded by the depressions 4, the walls of the depressions 4 forming sides of the mesa structures 9 (see FIG. 2).

Figure 3:
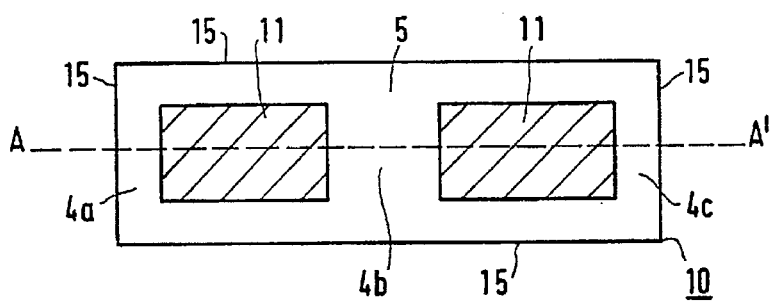
FIG. 3 is a plan view of a semiconductor body manufactured by the method according to the invention.
Figure 4:
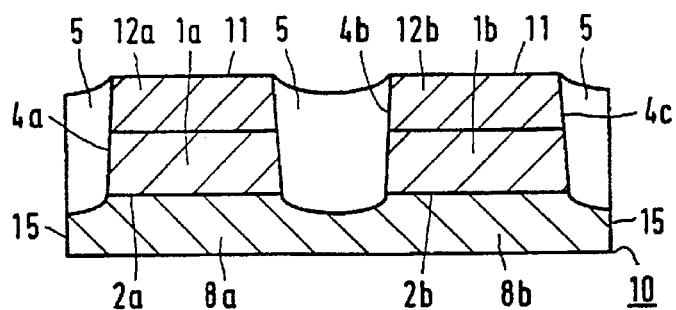
FIG. 4 is a cross-section taken on the line AA' in FIG. 3 of a semiconductor body made by the method according to the invention.

The slice of semiconductor material 1 is split up into separate semiconductor bodies 10 in that the slice 1 is broken through at the area of each depression 4 in the one system and every other depression 4a, 4c in the other system (see FIG. 3). The depressions 4 cut through the pn junction 2, so that the pn junction 2 comes to the surface on walls of the depressions 4. An insulating layer 5, for example made of glass or oxide, is accordingly provided on these walls, for example, by known techniques such as electrophoresis or chemical vapour deposition (CVD). A thin layer of insulating material (approximately 5–10 μm thick) is thus provided on the wall of the depression 4. FIGS. 3 and 4 show a semiconductor body 10 made by the method. Semiconductor material below the depression 4b forms an electrical connection between regions 8a, 8b at one side of the pn junctions 2a, 2b (FIG. 4). The regions 1a, 1b, 12a, 12b at the other side of the pn junctions 2a, 2b are insulated from one another by the depression 4b. Thus it is possible to manufacture, for example, a number of diodes provided with a common anode or cathode.

It is known to manufacture semiconductor devices through the provision of depressions 4 in each of the two main surfaces 3, 6 of the slice of semiconductor material 1, whereupon the slice 1 is split up into semiconductor bodies 10 of two diodes each. A layer of insulating material 5 is then provided on the walls of the depressions 4. Such a method has the disadvantage that the provision of the layer of insulating material 5 on the walls of the depressions 4 is difficult because it is provided after the slice 1 has been split up into separate semiconductor bodies 10. The semiconductor bodies 10 are comparatively small and therefore difficult to handle. Since grooves are made in both main surfaces 3, 6 of the slice 1, moreover, the bodies must be provided with an insulating layer 5 on both sides 3, 6.

According to the invention, the depressions 4 are provided in one main surface 3 only of the slice 1, and the layer of insulating material 5 is deposited before the slice 1 is split up. The application of the insulating layer 5 on the walls of the depressions 4 can thus be carried out in a simple manner in that an insulating layer 5 is provided in all depressions 4 when the slice of semiconductor material 1 has not yet been split up into separate semiconductor bodies 10. One slice of semiconductor material 1 is easier to handle than many separate bodies 10. In addition, the said layer 5 now need only be provided on walls of depressions 4 in one main surface 3. It is found to be not necessary in practice to cover surfaces 15 (see FIGS. 3, 4), which were created after splitting-up of the slice 1, with the insulating layer 5.

The slice of semiconductor material 1 is weakened by the application of the depressions 4. When the semiconductor body is placed, for example, on a pc-board, the semiconductor body 10 may fracture at the areas of depressions 4. Preferably, the layer of insulating material 5 is provided to such a thickness in the method that the depressions 4 are practically entirely filled with insulating material 5 (see FIG. 4). The semiconductor body 10 is much stronger now, so that problems in the placement of the semiconductor body are avoided.

It is found in practice that the electrical connection between regions 8a, 8b formed by semiconductor material below the depression 4b is often of an insufficiently low ohmic value. It is known to provide the semiconductor body 10 on an insulating substrate which is provided with a conducting layer which interconnects the regions 8a and 8b in a sufficiently low-ohmic manner. In the method according to the invention, preferably, the slice is first fastened to an electrically conducting auxiliary slice 20, preferably made of the semiconductor material (see FIGS. 5 to 10), after which the auxiliary slice 20 is split up together with the slice of semiconductor material 1.

Figure 5:
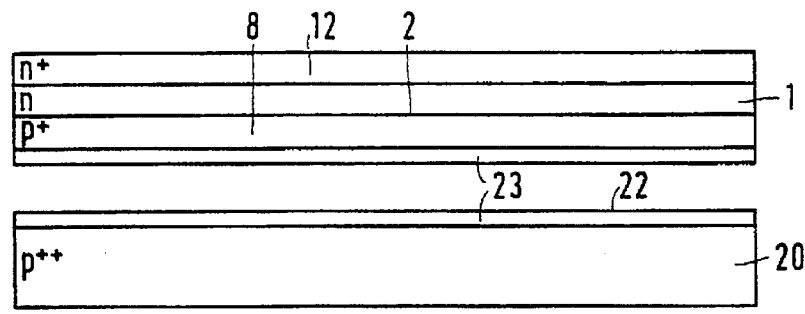
FIGS. 5 to 9 show various stages in the manufacture of a semiconductor body by the method according to the invention, FIG. 7 being a plan view and FIGS. 5, 6, 8 and 9 being cross-sections taken on the line AA' in FIG. 7, FIGS. 10, 11 are cross-sections of embodiments of semiconductor bodies made by the method according to the invention.
Figure 6:
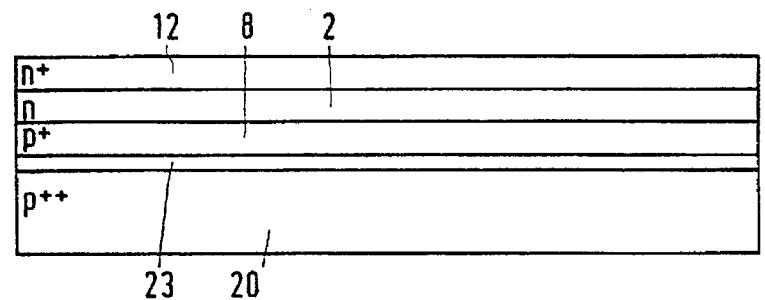
Figure 7:
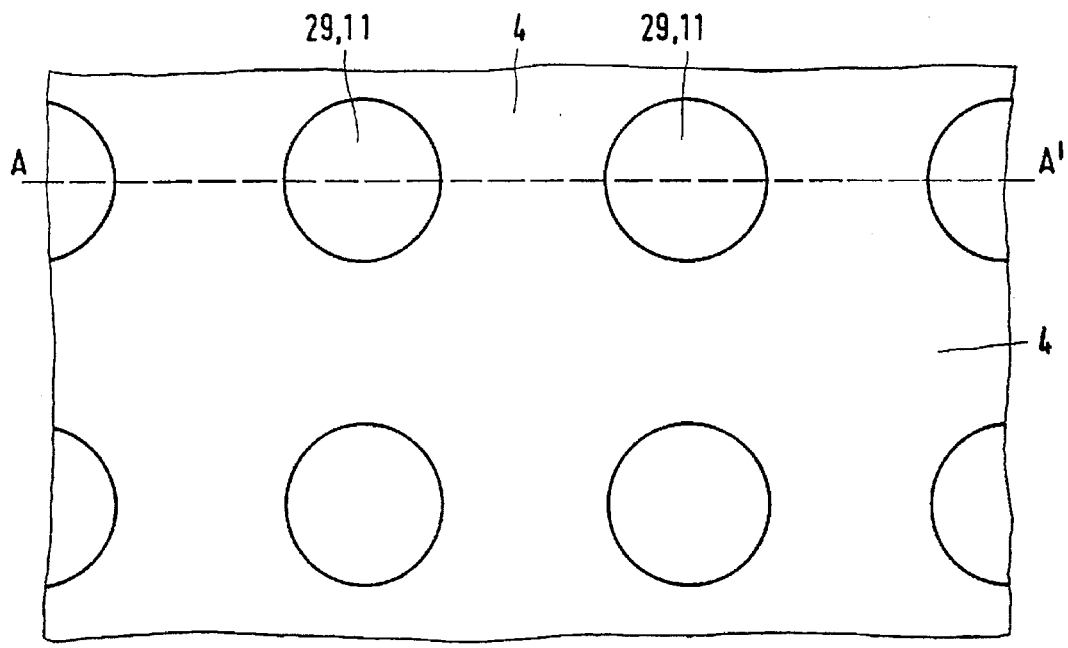
Figure 8:
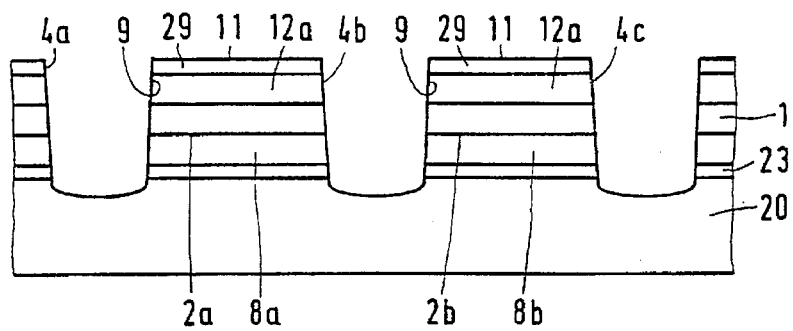

FIGS. 5 to 10 show an embodiment of the method by which this semiconductor device is manufactured. FIG. 5 shows a slice of semiconductor material 1 with an n-type doping provided with regions 12 and 8 which are $n^+$- and $p^+$-type doped, respectively, so that a pn junction 2 is created between the n-type slice 1 and the region 8. The slice of semiconductor material 1 is fastened on a surface 22 of an electrically conducting auxiliary slice 20. A $p^{++}$-type silicon slice is used, for example, as the electrically conducting auxiliary slice 20. The slice of semiconductor material 1 is fastened on the auxiliary slice 20, for example by alloying with a metal layer 23 of silver, palladium or aluminium, for example with an aluminium layer of approximately 10 μm thickness. For this purpose, an aluminium layer 23 of approximately 5 μm thickness is provided on the auxiliary slice 20 and on the semiconductor slice 1, after which the slice 1 and auxiliary slice 20 are placed against one another with their aluminium layers 23 and a heat treatment is carried out at approximately 700° C. for approximately 10 minutes (see FIG. 6). Alternatively, the metal layer 23 may obviously be provided on one of the slices 1, 20. Since both the region 8 adjoining the metal layer 23 and the material of the auxiliary slice have a p-type doping, and since aluminium gives a p-type doping upon diffusion into a silicon slice, a good electrical connection between the slice 1 and the auxiliary slice 20 is formed. Subsequently, the depressions 4 are provided in that material is removed from the slice of semiconductor material 1 by bombardment with abrasive particles. In such a process, also called sand blasting or shot peening, as applicable, portions of the slice of semiconductor material 1 can be removed in a simple manner and with a comparatively high accuracy. Those regions where the upper surfaces 11 of the mesa structures 9 are to be situated are covered on the slice of semiconductor material 1 during this, for example, by means of steel plates 29 which are glued to the surface 3 (see FIG. 7 for a plan view and FIG. 8 for a lateral view). The shape of the mesa structures 9 is determined by the shape of these plates 29. The uncovered surface of the slice of semiconductor material 1 is then removed by blasting with, for example, $Al_2O_3$ particles, after which the plates 29 are removed through dissolving of the adhesive. Such a method has an additional advantage over, for example, an etching process that it is an environmentally comparatively clean method because the abrasive particles can be collected and re-used afterwards. The depressions 4 may continue, for example, into the auxiliary slice 20 and be so provided that the mesa structures 9 form individual semiconductor bodies which are still interconnected by the auxiliary slice 20 (see FIG. 8).

The use of the auxiliary slice has an additional advantage. It is difficult in practice, when only a single slice of semiconductor material 1 is used, to make depressions 4 to such a depth that the pn junction 2 is fully cut through. Only a slight deviation in the depth of the depression 4 will result in fracture of the slice 1 or insufficient separation of the pn junction 2. It is also found to be difficult to break the slice 1. Often the slice 1 will also break in depressions 4b which are to remain intact. The use of an auxiliary slice 20 considerably reduces these problems.

In an advantageous embodiment of the method according to the invention the layer of insulating material 5 is provided in that the depressions 4 are filled with a glass dispersion and the auxiliary slice 20 together with the slice 1 is subsequently subjected to a heat treatment (see FIG. 9). Depressions 4 can be provided in a comparatively simple manner to a comparatively great width 30 by means of the sand blasting process for providing the depressions 4, so that it is easy to provide the glass dispersion. The layer of insulating material 5 may then be provided in a simple manner with sufficient accuracy in the depressions 4 and with a sufficient thickness. Thus, for example, zinc-borate or lead-borate glass is deposited as a dispersion in the depression 4 from a dispensing device such as a nozzle. The dispersion remains in the depressions 4 owing to its surface tension and does not spread over the upper surface 11 of the mesa structures 9. It is not necessary, therefore, to remove the layer of insulating material from, for example, the upper surfaces 11 of the mesa structures 9 by means of an etching treatment after the layer of insulating material 5 has been provided. The heat treatment is carried out for approximately 20 minutes at 720° C. The glass dispersion is sintered by the elevated temperature of the heat treatment, so that the layer of insulating material 5 is given good insulating and passivating properties.

Figure 9:
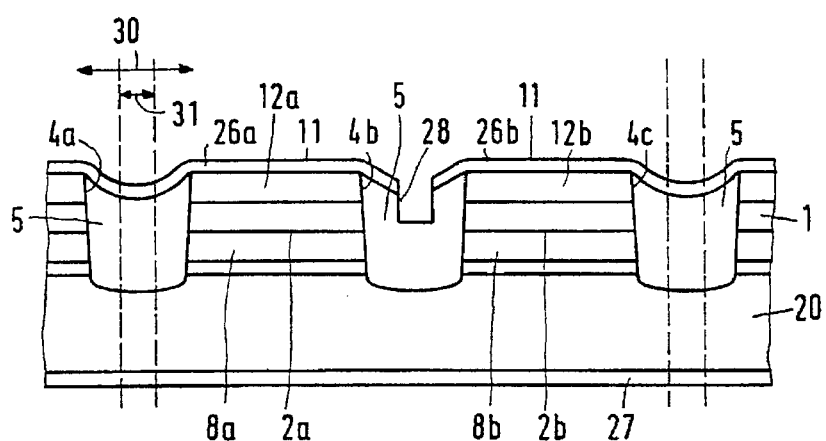
Figure 10:
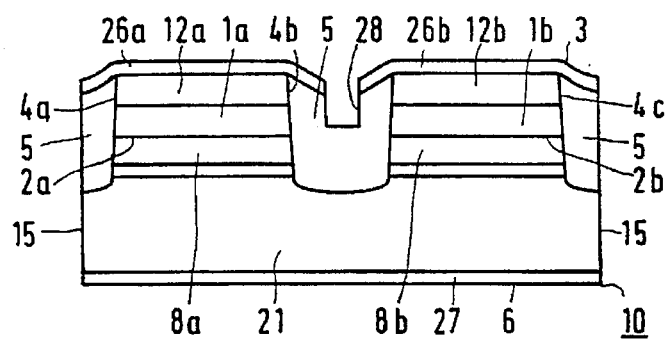

In order to be able to connect the individual pn junctions 2a, 2b in the separate semiconductor bodies 10, each pn junction 2a, 2b at the upper side 11 of the mesa 9 must be provided with an electrode 26a, 26b (see FIG. 10). In an advantageous embodiment of the invention, a conductive layer 26 is provided on the main surface 3 that has the depressions 4 before the slice 1 is split up, after which the conductive layer 26 is interrupted at the areas of depressions 4b in that grooves 28 are provided in the conductive layer 26, which grooves extend into the insulating layer, after which the slice 1 is split up into separate semiconductor bodies 10 (see FIGS. 9, 10). The grooves 28 in the conductive layer 26 may be provided, for example, by etching or wire sawing. The grooves 28 need be provided only in these depressions 4b which in the separate semiconductor bodies 10 separate the pn junctions 2a, 2b in the semiconductor body 10. During splitting-up of the slices 1, 20, during which the separate semiconductor bodies 10 are formed, the separate electrodes 26a, 26b on the upper faces 11 of the mesa structures 9 are also formed. The electrodes 26a, 26b then overlap the layer of insulating material 5. When a voltage is applied across the semiconductor device, the overlap of the electrodes 26a, 26b over the layer of insulating material 5 provides the advantage that an electric field present in the semiconductor device is reduced, especially adjacent the upper side 11 of the semiconductor body 10.

The depressions 4 are provided to a certain width 30, and splitting-up is done by sawing, the width 30 of the depressions 4 being chosen to be greater than a sawcut 31 used during sawing (see FIG. 9). Such a width 30 of the depressions 4 renders it possible to split up the auxiliary slice 20 and the slice of semiconductor material 1 without the layer of insulating material 5 being damaged in those locations where the layer of insulating material 5 is provided over the pn junction 2. Sawing takes place from the upper side 3 of the semiconductor slice 1. Splitting-up can then be carried out to a higher accuracy because the depressions 4 are visible and it can be immediately checked whether the sawcut is made in the correct position.

Figure 11:
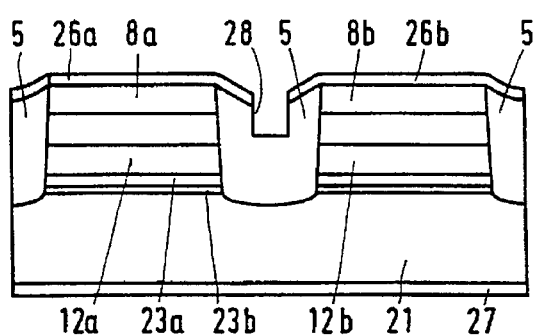

FIG. 10 shows a semiconductor device which was manufactured by the method. The semiconductor device comprises a semiconductor body 10 with pn junctions 2a, 2b extending parallel to its upper and lower surfaces and which are mutually separated by one or several depressions 4b provided in the upper surface, so that the pn junctions 2a, 2b form individual diodes which are all connected to a first region 8a, 8b, 21 at one side of the pn junction 2a, 2b, which region adjoins the lower surface 6, while each individual diode is connected to a further region 1a, 1b, 12a, 12b at the other side of the pn junction 2a, 2b, which further region adjoins the upper surface 3, while walls of the depression 4 are covered by a layer of insulating material 5. According to the invention, the semiconductor body 10 comprises an electrically conducting support body 21, preferably made of the semiconductor material, which forms part of the first region, while a recess 4a, 4c is formed around the semiconductor body 10 extending up to the upper surface 3 of the semiconductor body 10 and covered by a layer of insulating material 5. The recess 4a, 4c is formed by the depression 4 after sawing-through of the slice 1 and the auxiliary slice 20. Compared with known semiconductor devices, this semiconductor device has the advantage that it can be manufactured by the said method in a comparatively simple manner. In addition, the presence of the support body 21 ensures a good electrical connection between the diodes formed by the pn junctions 2a, 2b. The support body 21 is preferably made from the same semiconductor material as the semiconductor slice 1. No problems involving differences in coefficient of expansion owing to temperature will arise in that case. A semiconductor body with two diodes is made by the method described, the p-type regions 8a and 8b being interconnected by the support body 21. Two diodes are thus created with a common anode. A semiconductor body with a common cathode may be manufactured in a simple manner in that the semiconductor body 1 is connected upside-down to the support body 21 (see FIG. 11). The slice of semiconductor material 1 is then so fastened on the auxiliary slice 20 that the $n^+$-region 12 adjoins the $p^{++}$-auxiliary slice 20. No extra pn junction arises between the region 12 and the support body 21 owing to the metal layer 23. Preferably, a double layer 23a, 23b is taken as the metal layer 23, such that an aluminium layer 23b adjoins the p-type doped material of the support body 21 and, for example, a molybdenum layer 23a adjoins the n-type doped material of the region 12, because molybdenum gives an n-type doping upon diffusion into a silicon slice. In addition, the molybdenum layer acts as a diffusion barrier against aluminium, so that aluminium cannot penetrate the $n^+$-layer 12a.

Figure 12:
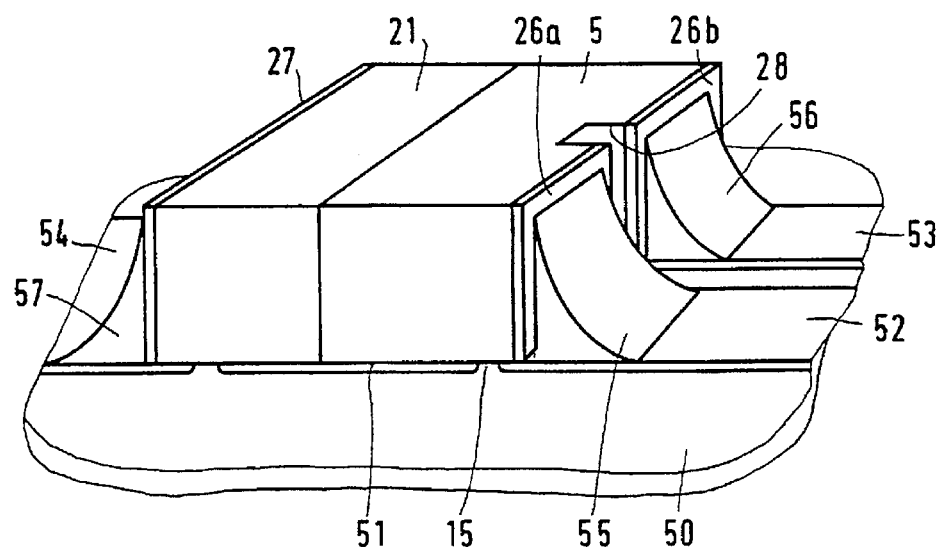
FIG. 12 is a perspective view of a semiconductor device made by the method according to the invention, with a semiconductor body mounted on a pc-board.

The semiconductor device may be given a final mounting in a diode casing, for example, on a metal lead frame, and be provided with an envelope of synthetic material. Preferably, a slice of the semiconductor material is used as the auxiliary slice 20, upon which splitting-up is done by sawing, so that the separate semiconductor bodies 10 are each provided with a plane sawcut surface 15 which is suitable as a mounting surface 15 for the semiconductor bodies 10, the auxiliary slice 20 having such a thickness that semiconductor bodies 10 of standard dimensions for surface mounted devices are obtained (see FIG. 12). Splitting-up is done by sawing, for example, by wire sawing, in this case perpendicular to a main surface 3 of the slice of semiconductor material 1. The sawcut surface 15 is then so smooth and plane that it can be used as the mounting surface 15. The semiconductor device is then suitable for direct mounting on a pc-board 50 as a surface mounted device (SMD). When a slice of semiconductor material of such a thickness is used for the auxiliary slice 20 that a surface mounted device of standard dimensions is obtained, mounting of a semiconductor device obtained by the method becomes readily possible with standard machines. The semiconductor device may be placed on a pc-board 50 with its mounting surface 15 and be glued with an adhesive 51, after which conductor tracks 52, 53 and 54 on the pc-board 50 are electrically connected to the electrodes 26a, 26b and the support body 21, respectively, or to the electrode 27, if present (see FIG. 12). An electrical connection to the conductor tracks 52, 53, 54 may be achieved, for example, with soldered joints 55, 56, 57.

Figure 13:
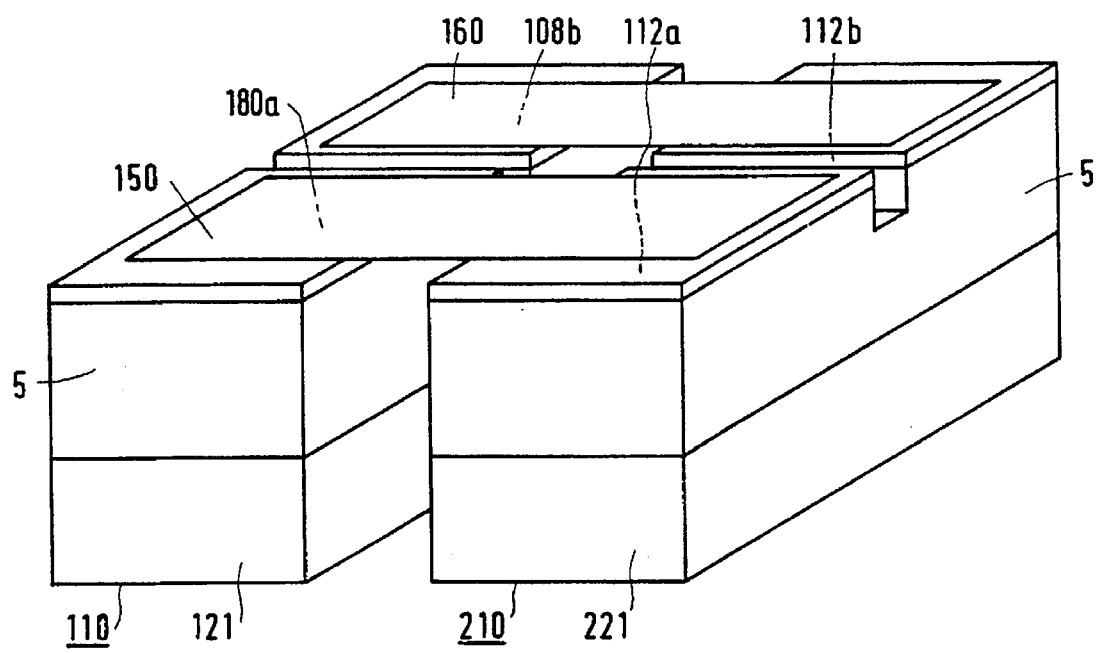
FIG. 13 is a perspective view of a semiconductor device made by the method according to the invention, with semiconductor bodies interconnected so as to form a bridge cell.

Preferably, the semiconductor device comprises a first semiconductor body 110 with two individual diodes sharing a first region 121 which acts as a common cathode and a second semiconductor body 210 with two individual diodes sharing a first region 221 which acts as a common anode, while the first and second semiconductor body 110, 210 are interconnected by two connection strips 150, 160 between the further regions 108a, 108b of the first body 110 and the regions 112a, 112b of the second semiconductor body 210 (see FIG. 13) so as to form a bridge cell. The region 108a is here connected to the region 112a through the connection strip 150, and the region 108b to the region 112b through the connection strip 160. The two semiconductor devices may be mounted immediately next to one another. A very compact bridge cell is obtained in this manner which is easy to manufacture by the method according to the invention. The bridge cell may be provided with an envelope of synthetic resin, if so desired, connection wires being applied to the regions 121, 221 and to the connection strips 150 and 160.

Although certain techniques were used as described above, it will be obvious that alternative techniques may be used without departing from the scope of the invention. The electrodes 26 and 27 may be made from alternative conducting materials such as, for example solder or Ti—Ni—Ag. The auxiliary slice 20 and the slice of semiconductor material may also be fastened to one another by techniques such as wafer bonding. The auxiliary slice may alternatively be made from a different conducting material than highly doped semiconductor material, for example, copper. The auxiliary slice and the slice of semiconductor material may be split up into bodies 10 at the areas of depressions alternatively by means of, for example, breaking or etching of grooves, both from the upper side 3 and from the lower side 6 of the slice 1 or the auxiliary slice 20.

The invention is not limited to the embodiment described above in which the semiconductor body 10 comprises two diodes. The invention also applies to semiconductor devices comprising semiconductor bodies with more than two diodes. Thus semiconductor bodies 10 with more than two diodes may be manufactured in a simple manner in that the semiconductor slice 1 is split up not through every second depression 4a, 4c, but through every third or fourth depression. Semiconductor bodies are created thereby comprising 1×3, 1×4, etc diodes. Obviously, semiconductor bodies with, for example, 2×2, 2×3, or 3×3, etc diodes may also be manufactured. The semiconductor bodies may comprise further elements other than the pn junction 2. Thus, for example, resistors or transistors may also be realised in the mesa structures 9.

We claim:

1. A method of manufacturing semiconductor devices from a slice of semiconductor material having a thickness, said slice of semiconductor material having a main pn junction extending parallel to first and second main surfaces of the slice, said method comprising the steps of:

A) fastening the slice of semiconductor material to an electrically conducting auxiliary slice;

B) providing depressions of substantially the same depth in the first main surface of the slice of semiconductor material, said depressions cutting through the main pn junction and having a depth which is less than the thickness of said slice, to divide the main pn junction into separate pn junction portions, said depressions being divided into a first and a second subgroup of depressions;

C) providing an insulating layer in the depressions; and

D) splitting the slice of semiconductor material and the auxiliary slice into separate semiconductor bodies only at each of the depressions in the first subgroup; the division of depressions into the first and the second subgroup being such that each semiconductor body is provided with at least two separate pn junction portions, the pn junction portions being mutually insulated by at least one depression of the second subgroup.

2. A method as claimed in claim 1, wherein the insulating layer is provided to a sufficient thickness such that the depressions are substantially entirely filled with the insulating layer.

3. A method as claimed in claim 1, wherein the insulating layer is provided by filling the depressions with a glass dispersion and subsequently subjecting the auxiliary slice and the slice of semiconductor material to a heat treatment.

4. A method as claimed in claim 1, wherein the slice and the auxiliary slice are split by sawing, a sawcut created during sawing having a first width, and the depressions having a second width greater than that of the first width.

5. A method as claimed in claim 1, wherein the depressions are provided by bombardment of the first main surface of the slice of semiconductor material with abrasive particles.

6. A method as claimed in claim 1, wherein the auxiliary slice is a made of semiconductor material and has a thickness such that semiconductor bodies of standard dimensions are obtained, and the slice and the auxiliary slice are split by sawing, thereby providing each separate semiconductor body with a plane sawcut surface which is suitable as a mounting surface for the semiconductor body.

7. A method as claimed in claim 1, further comprising, between step C) and step D), the steps of:

providing a conductive layer on the first main surface; and providing grooves in the conductive layer at the depressions, the grooves extending into the insulating layer.

8. A method as claimed in claim 6, wherein the grooves are provided only in the depressions of the second subgroup.

9. A method as claimed in claim 1, wherein the auxiliary slice is made of the same semiconductor material as the slice of semiconductor material.

* * * * *